(12) United States Patent
Bhat et al.

(10) Patent No.: US 8,124,528 B2
(45) Date of Patent: Feb. 28, 2012

(54) METHOD FOR FORMING A RUTHENIUM FILM

(75) Inventors: Vishwanath Bhat, Boise, ID (US); Dan Gealy, Kuna, ID (US); Vassil Antonov, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 12/100,632

(22) Filed: Apr. 10, 2008

(65) Prior Publication Data

US 2009/0257170 A1 Oct. 15, 2009

(51) Int. Cl.
*H01L 21/44* (2006.01)
(52) U.S. Cl. .......... 438/654; 438/680; 257/E21.648
(58) Field of Classification Search .......... 438/654, 438/655, 680, 681, 682
See application file for complete search history.

(56) References Cited

U.S. PATENT DOCUMENTS

| | | | |
|---|---|---|---|
| 5,372,849 A | 12/1994 | McCormick et al. | |
| 5,962,716 A | 10/1999 | Uhlenbrock et al. | |
| 6,063,705 A | 5/2000 | Vaartstra | |
| 6,197,628 B1 * | 3/2001 | Vaartstra et al. | 438/238 |
| 6,281,125 B1 * | 8/2001 | Vaartstra et al. | 438/681 |
| 6,437,417 B1 | 8/2002 | Gilton | |
| 6,461,909 B1 | 10/2002 | Marsh et al. | |
| 6,462,367 B2 | 10/2002 | Marsh et al. | |
| 6,465,828 B2 | 10/2002 | Agarwal | |
| 6,734,100 B2 | 5/2004 | Park et al. | |
| 6,737,313 B1 | 5/2004 | Marsh et al. | |
| 6,764,895 B2 * | 7/2004 | Marsh et al. | 438/238 |
| 6,824,816 B2 | 11/2004 | Aaltonen et al. | |
| 6,846,711 B2 | 1/2005 | Yamasaki et al. | |
| 7,002,033 B1 | 2/2006 | Sakai et al. | |
| 7,148,555 B2 | 12/2006 | Yates et al. | |
| 2001/0020715 A1 | 9/2001 | Yamasaki et al. | |
| 2002/0013052 A1 * | 1/2002 | Visokay | 438/681 |
| 2002/0142538 A1 | 10/2002 | Marsh et al. | |
| 2003/0015769 A1 | 1/2003 | DeBoer et al. | |
| 2003/0109110 A1 * | 6/2003 | Kim | 438/398 |
| 2003/0213986 A1 | 11/2003 | Takamatsu et al. | |
| 2005/0020060 A1 | 1/2005 | Aaltonen et al. | |
| 2005/0161710 A1 | 7/2005 | DeBoer et al. | |
| 2005/0221002 A1 | 10/2005 | Nakamura et al. | |
| 2005/0238808 A1 | 10/2005 | Gatineau et al. | |
| 2006/0145294 A1 | 7/2006 | Bhat et al. | |
| 2006/0177601 A1 * | 8/2006 | Park et al. | 427/576 |
| 2006/0251813 A1 | 11/2006 | Carlson et al. | |
| 2007/0037392 A1 | 2/2007 | Thompson | |
| 2007/0082132 A1 | 4/2007 | Shinriki et al. | |

(Continued)

FOREIGN PATENT DOCUMENTS

JP 11340435 12/1999

(Continued)

OTHER PUBLICATIONS

Miki et al., IEEE Transactions on Electron Devices, vol. 52, No. 8, Aug. 2005, pp. 1832-1837.

(Continued)

*Primary Examiner* — Charles Garber
*Assistant Examiner* — Reema Patel
(74) *Attorney, Agent, or Firm* — Whyte Hirschboeck Dudek SC

(57) ABSTRACT

Methods for forming ruthenium films and semiconductor devices such as capacitors that include the films are provided.

37 Claims, 4 Drawing Sheets

U.S. PATENT DOCUMENTS

| | | |
|---|---|---|
| 2007/0111434 A1 | 5/2007 | Ikeda |
| 2007/0148896 A1 | 6/2007 | Nakamura et al. |
| 2007/0160756 A1 | 7/2007 | Treichel |
| 2007/0190781 A1 | 8/2007 | Wai et al. |
| 2007/0190782 A1 | 8/2007 | Park |
| 2007/0207588 A1 | 9/2007 | Basceri et al. |
| 2007/0218205 A1 | 9/2007 | Hendrix et al. |
| 2007/0218316 A1 | 9/2007 | Inomata |
| 2007/0231927 A1 | 10/2007 | Yamakawa et al. |
| 2007/0264838 A1 | 11/2007 | Krishnan et al. |
| 2009/0022891 A1 | 1/2009 | Sakai et al. |
| 2009/0035466 A1 | 2/2009 | Kawano et al. |

FOREIGN PATENT DOCUMENTS

| | | |
|---|---|---|
| JP | 2001036027 | 2/2001 |
| JP | 2007067015 | 3/2007 |
| KR | 20030051231 | 6/2003 |

OTHER PUBLICATIONS

A. Jaworek, J. Mater Sci (2007) 42:266-297.

David B. Terry, Dissertation of a Holistic Investigation of Alternative Gate Stack Materials for Future CMOS Applications, North Carolina State University, 2006, pp. i-127.

* cited by examiner

METHOD FOR FORMING A RUTHENIUM FILM

TECHNICAL FIELD

Embodiments of the present disclosure relate to the field of semiconductor manufacture and, more particularly, to methods of forming a ruthenium metal layer in the fabrication of a semiconductor device, and devices resulting from those methods.

BACKGROUND OF THE INVENTION

Crystallographically textured tantalum oxide ($Ta_2O_5$) demonstrates approximately twice the dielectric permittivity of amorphous $Ta_2O_5$, making c-axis textured $Ta_2O_5$ very attractive as a DRAM cell dielectric. Metallic ruthenium is the bottom cell plate of choice for crystallographically textured, high permittivity $Ta_2O_5$ cell dielectrics because the $Ta_2O_5$ orders on the hexagonal close-packed (hcp) ruthenium structure and provides the high permittivity texturing.

Historically, there have been adhesion issues when ruthenium is deposited on silicon dioxide ($SiO_2$) and other dielectric films. This adhesion issue on oxide dielectrics has been addressed by adding disilane ($Si_2H_6$) to the initial stages of ruthenium deposition. However, XPS and SIMS analysis shows that about 20 at.-% silicon is present at the top surface of the deposited ruthenium film, which adversely affects the desired crystographically textured $Ta_2O_5$ deposition.

It would be desirable to provide a process for fabricating a ruthenium film that overcomes these problems.

BRIEF DESCRIPTION OF THE DRAWINGS

Embodiments of the invention are described below with reference to the following accompanying drawings, which are for illustrative purposes only.

DETAILED DESCRIPTION OF THE INVENTION

The following description provides illustrative examples of devices and methods according to embodiments of the present disclosure. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

An embodiment of a method according to the invention is described with reference to FIGS. 1-6, in a method of forming an electrode in a capacitor construction.

Figure 1:
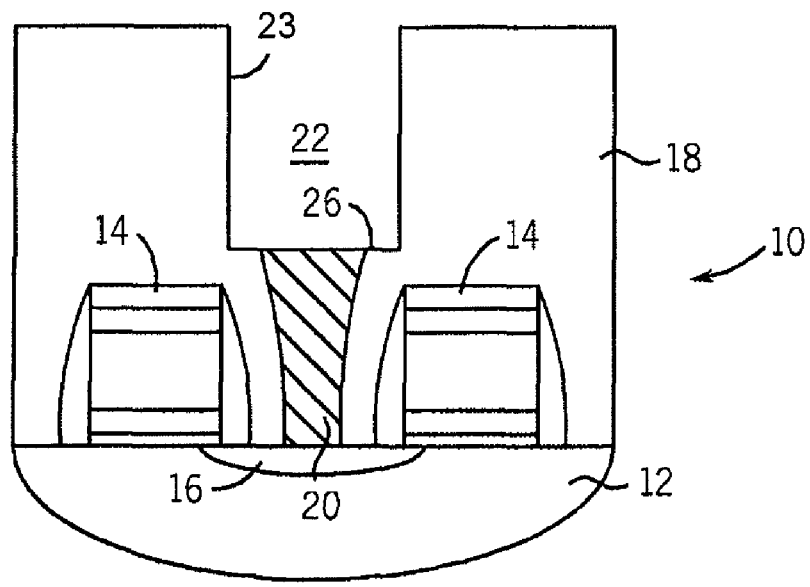
FIG. 1 is a diagrammatic cross-sectional view of a substrate at a preliminary step of a processing sequence.

Referring to FIG. 1, a substrate 10 (e.g., a wafer) is shown at a preliminary processing step in the formation of a capacitor. The substrate in progress can comprise, for example, a semiconductor wafer substrate or the wafer along with various process layers formed thereon, including one or more semiconductor layers or other formations, and active or operable portions of semiconductor devices.

In the illustrated embodiment, the substrate 10 comprises a material layer 12 such as polysilicon, wordlines 14, and a diffusion region (active area) 16 formed in the material layer 12 between the wordlines, the diffusion region 16 being in the form of a source/drain region. A dielectric (insulative) material 18 such as borophosphosilicate glass (BPSG), phosphosilicate glass (PSG), or other oxide (e.g., $SiO_x$, TEOS, etc.) or other suitable insulative material has been formed on the material layer 12 and over the wordlines 14. A plug 20 comprising doped polycrystalline has been deposited into an opening through the insulative layer 18 as an electrical contact with the diffusion region 16. The foregoing structures can be formed by conventional methods known and used in the art. A container or opening 22 with sidewalls 23 and a base portion or floor 26, has been conventionally etched into the insulative layer 18 to expose the plug 20.

A lower electrode of ruthenium is then formed within the opening 22 within the insulative material layer 18.

Figure 2:
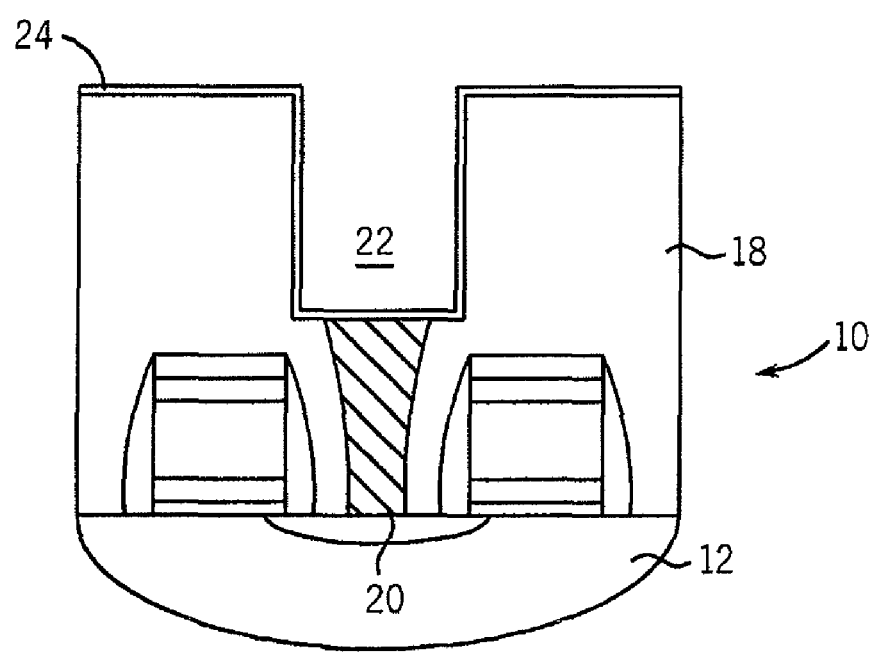
FIGS. 2-6 are views of the substrate of FIG. 1 at subsequent processing steps according to according to an embodiment of the invention.

Referring to FIG. 2, according to an embodiment of a method of the invention, an adhesion or nucleation (seed) layer 24 is formed on the insulative material layer 18 within the opening to improve adherence of the subsequently deposited ruthenium electrode layer to the insulative material layer 18. An adhesion layer 24 composed of ruthenium silicide ($RuSi_x$) can be formed, for example, by sputter depositing from a deposition target of $RuSi_x$, by physical vapor deposition (PVD) of $RuSi_x$, by atomic layer deposition (ATD), or by chemical vapor deposition (e.g., CVD, LPCVD, APCVD, PECVD, etc.) using a silicon precursor gas and a ruthenium precursor gas.

In other embodiments, the adhesion (seed) layer 24 can be composed of $RuSi_xO_y$, and formed, for example, by a process as described, for example, in U.S. Pat. No. 6,461,909 (Marsh et al., Micron Technology, Inc.).

In the illustrated embodiment, a $RuSi_x$ adhesion layer 24 is formed by CVD, for example, by exposing the substrate 10 to a gaseous mixture of a silicon precursor gas and a ruthenium precursor gas at a ratio of about 50:1 to about 1:1 for a duration of about 0.5-20 seconds, or about 1-10 seconds to form the adhesion layer 24 to a thickness of about 1-20 angstroms, or about 1-10 angstroms. In embodiments of the method, the flow rate of the silicon precursor is about 1-100 sccm (or about 20-80 sccm), the flow rate of the ruthenium precursor is about 1-20 sccm (or about 1-10 sccm), and the flow rate of an optional carrier gas is about 50-1000 sccm (or about 200-500 sccm). General CVD processing parameters include a deposition pressure of about 0.1-20 torr, and a deposition temperature at the substrate surface of about 100-700° C., or about 200-500° C. .

In some embodiments, the silicon precursor is initially deposited onto the insulative material layer 18 to form a thin seed layer ranging from a monolayer (e.g., about 2 angstroms to about 5 angstroms thick). Both the silicon and ruthenium precursors can then be flowed into the reaction chamber to deposit the $RuSi_x$ adhesion layer 24.

Examples of silicon precursor gases include a silicon hydride or silane such as silane ($SiH_4$), disilane ($Si_2H_6$), trisilane ($Si_3H_8$), dichlorosilane (DCS, $SiH_2Cl_2$), trichlorosilane (TCS, $SiHCl_3$), hexachlorodisilane ($Si_2Cl_6$), trisilylamine ($N(SiH_3)_3$), methylated silanes, among others.

Any ruthenium containing precursor can be used in accordance with the present disclosure. Typical ruthenium precursors for CVD deposition include liquid ruthenium metalorganic precursors. The ruthenium precursor can be contained in a bubbler reservoir through which a carrier gas, such as helium or any other inert gas (e.g., nitrogen, argon, neon, and xenon), is bubbled through the reservoir containing the precursor to deliver the precursor to the reaction chamber. For example, a carrier gas having a volumetric flow rate in the range of about 1-500 sccm can be used in a bubbler having a pressure in the range of about 0.5-50 torr and a temperature in the range of about 30-70° C. to deliver a ruthenium precursor to the reaction chamber.

Ruthenium precursors include liquid ruthenium complexes of the following formula: (diene)Ru(CO)$_3$, wherein "diene" refers to linear, branched, or cyclic dienes, bicyclic dienes, tricyclic dienes, fluorinated derivatives thereof, combinations thereof, and derivatives thereof additionally containing heteroatoms such as halide, Si, S, Se, P, As, or N, as described, for example, in U.S. Pat. Nos. 6,063,705 and 5,962,716.

For example, the ruthenium precursor can be a ruthenocene having the formula (Cp')Ru or (Cp')Ru(Cp"), where Cp' and Cp" can be the same or different and have the following formula:

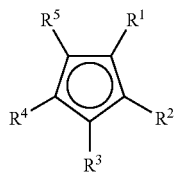

wherein $R^1$-$R^5$ can be independently selected from the group consisting of H, F, and straight-chained or branched $C_1$-$C_5$ alkyl groups (e.g., Me, Et, i-Pr, n-Pr, t-Bu, n-Bu, sec-Bu, n-amyl, i-amyl, t-amyl, etc.). Nonlimiting examples of suitable ruthenocenes include bis(cyclopentadienyl)ruthenium, bis(ethylcyclopentadienyl)ruthenium, and bis(pentamethylcyclopentadienyl)ruthenium.

The ruthenium precursor can also be a ruthenium β-diketonate having the formula Ru(β-diketonate)$_3$, wherein the β-diketonate has the formula:

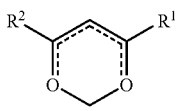

wherein $R^1$ and $R^2$ can be independently selected from the group consisting of H, F, straight-chained or branched $C_1$-$C_5$ alkyl groups (e.g., Me, Et, i-Pr, n-Pr, t-Bu, n-Bu, sec-Bu, n-amyl, t-amyl, etc.), and fluorine-substituted straight-chained or branched $C_1$-$C_5$ alkyl groups (e.g., Me, Et, i-Pr, n-Pr, t-Bu, n-Bu, sec-Bu, n-amyl, i-amyl, t-amyl, etc.). Nonlimiting examples of β-diketonates include 2,4-pentanedionate; 1,1,1-trifluoro-2,4-pentanedionate; 2,2,6,6-tetramethyl-3,5-heptanedionate; 1,1,1,5,5,5-hexafluoro-2,4-pentanedionate; 2,2,7-tetramethyl-3,5-octanedionato; 6,6,7,7,8,8,8-heptafluoro-2,2-dimethyl-3,5-octanedionato; and 2,4-octanedionato. In an embodiment, $R^1$ and $R^2$ are independently selected from the group consisting of $C_1$-$C_5$ fluoroalkyl groups.

The ruthenium precursor can also be a ruthenium carbonyl such as Ru(CO)$_5$, Ru$_3$(CO)$_{12}$, Ru(CO)$_9$, (C$_6$H$_8$)Ru(CO)$_3$, and (C$_7$H$_{10}$)Ru(CO)$_3$, and cyclopentadienyl dicarbonyl ruthenium (II) dimer.

Additional precursors and methods of depositing ruthenium layers are generally discussed in U.S. Pat. No. 5,372,849 to McCormick et al. (Minnesota Mining and Manufacturing Company (St. Paul, Minn.)).

A carrier gas can be used to deliver the precursor gas(es) to the reaction chamber, for example, an inert gas such as helium, nitrogen, neon, xenon, and/or argon. Optionally, a carrier or dilution gas (e.g., He, Ar, etc.) can be introduced into the reaction chamber to alter the concentrations of the gases therein, for example, at a varied flow rate. Oxidizing gases can also be introduced into the reaction chamber when desired.

Figure 3:
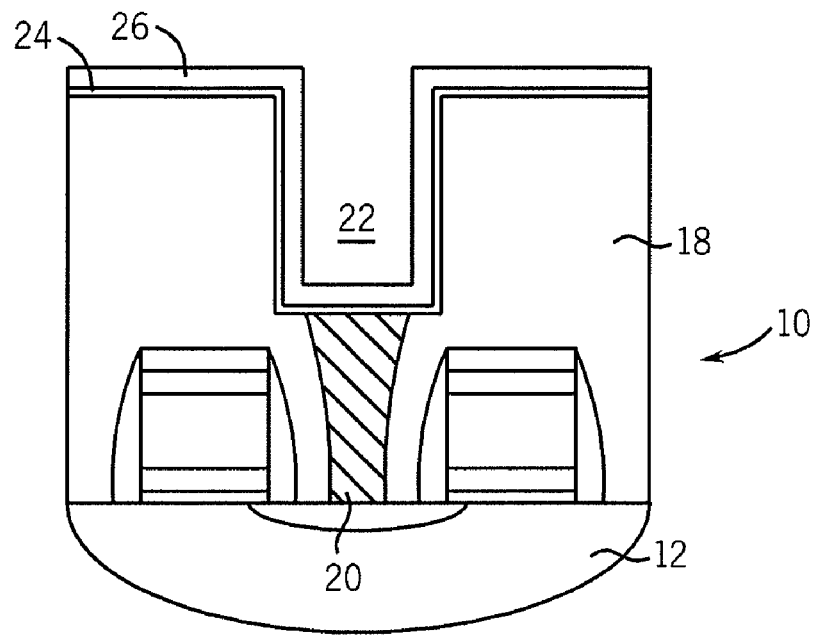

Referring now to FIG. 3, a ruthenium layer or film 26 is then formed on the adhesion or nucleation (seed) layer 24 by chemical vapor deposition processing (e.g., CVD, LPCVD, APCVD, PECVD, etc.). The flow of the silicon precursor is terminated and a hydrogen source gas is flowed with the ruthenium precursor gas to form a hydrogen-treated ruthenium layer 26. In embodiments of the method, the hydrogen source gas is hydrogen gas (H$_2$), and in other embodiments, ammonia (NH$_3$) is used. Optionally, a carrier gas (e.g., He, Ar, etc.) can be used. CVD processing conditions can be as described for forming the RuSi$_x$ adhesion layer 24. The ruthenium layer 26 can by formed by CVD, for example, by exposing the substrate 10 to a gaseous mixture of a ruthenium precursor gas and a hydrogen source gas (e.g., H$_2$ or NH$_3$) at a ratio of about 0.001:1 to about 1:1 for a duration effective to deposit the desired thickness, generally at least about 100 angstroms, e.g., about 100-300 angstroms, or about 150-250 angstroms. In embodiments of the method, the flow rate of the ruthenium precursor is about 1-20 sccm (or about 1-10 sccm), and the flow rate of the hydrogen source gas is at least about 200 sccm, and in other embodiments at least about 400 sccm (e.g., about 400-600 sccm). The flow rate of an optional carrier gas can be about 50-1000 sccm (or about 200-600 sccm). In an embodiment, the ruthenium precursor gas flows continuously during CVD processing as the flow of the silicon precursor gas is terminated and flow of the hydrogen source gas is commenced.

The incorporation of hydrogen in the ruthenium layer 26 functions to reduce or eliminate the diffusion of silicon into the bulk ruthenium layer to below detectable levels, particularly in the upper surface of the ruthenium layer 26 (e.g., to a depth of about 10-30 angstroms). The incorporation of hydrogen can further function to promote densification and reduce the porosity of the ruthenium layer 26, increase the stability of the ruthenium layer in air, and improve the uniformity of the ruthenium layer.

Figure 4:
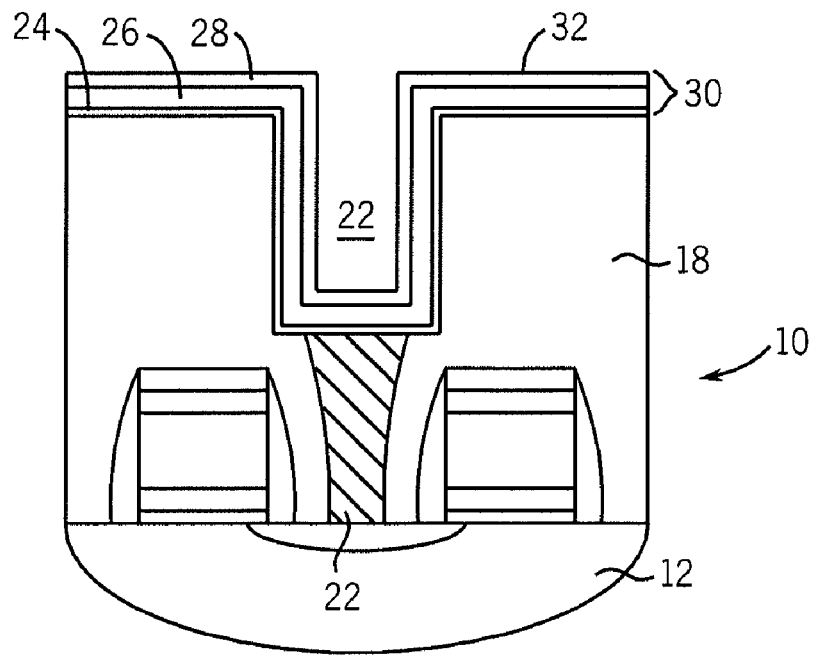

Optionally, as depicted in FIG. 4, in some embodiments, the flow of the hydrogen source gas can be terminated and the ruthenium precursor gas can be flowed to form an additional ruthenium layer 28 over the hydrogen-treated ruthenium layer 26. The ruthenium layer 28 can be formed to a desired thickness at about 0-300 angstroms, or about 0-100 angstroms. The combined layers 24, 26, 28 form the lower electrode 30, which typically has a total thickness of about 50-300 angstroms, or about 50-100 angstroms.

Due, at least in part, to the addition of the hydrogen source gas during the formation of the ruthenium material layer 26, diffusion of silicon from the initial adhesion (seed) layer 24 into the upper portion of the hydrogen-treated ruthenium layer 26 is eliminated and the surface 32 of the ruthenium electrode 30 is substantially or completely silicon-free, i.e., 0-0.01 at.-% silicon by x-ray photoelectron spectroscopy (XPS) and/or secondary ion mass spectroscopy (SIMS) analysis. The resulting ruthenium electrode 30 is a graded layer with the content (at.-%) of ruthenium increasing and the silicon concentration decreasing from the adhesion layer (e.g., $RuSi_x$) 24 to the surface 32 of the ruthenium electrode 30 (e.g., the surface of the hydrogen-treated ruthenium layer 26). In some embodiments, the ruthenium electrode 30 is a graded layer in which the adhesion layer 24 (e.g., $RuSi_x$) has a high silicon content of about 10-90 at.-% and ruthenium content of about 10-90 at.-%, with the silicon content decreasing progressively through the hydrogen-treated ruthenium layer 26 to a non-detectable level (ie., 0-0.01 at.-%) at the surface 32 of the ruthenium electrode 30. In some embodiments, the ruthenium electrode 30 has a surface atomic concentration of ruthenium greater than about 50 at.-%, or about 50-80 at.-% with the resistivity of the film at about 100-1,000% of the bulk ruthenium.

The resulting electrode 30 has a lowered resistivity (Rs value), improved film uniformity, and higher film stability, e.g., in an ambient environment, with little or no degradation occurring upon exposure to air.

Figure 5:
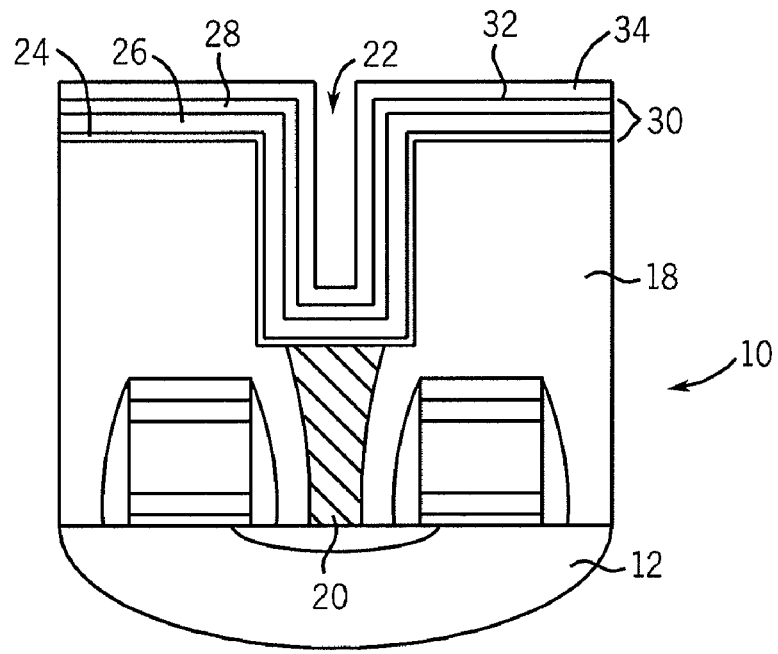

Referring now to FIG. 5, a dielectric (insulating) layer 34 is formed on the surface 32 of the ruthenium electrode 30. In embodiments of the invention, the dielectric layer 34 comprises a dielectric material having a high dielectric constant, for example, greater than about 7, or greater than about 50. In some embodiments, the dielectric layer 34 comprises tantalum oxide $Ta_2O_5$, and/or other metal oxide dielectric material, for example, barium strontium titanate ($Ba_xSr_{(1-x)}TiO_3$ (BST) where 0<x,1), $BaTiO_3$, $SrTiO_3$, $PbTiO_3$, $Pb(Zr,Ti)O_3$ (PZT), $(Pb,La)(Zr,Ti)O_3$ (PLZT), $(Pb,La)TiO_3$, (PLT), $Ta_2O_5$, $KNO_3$, $LiNbO_3$, $HfO_2$, and/or $Al_2O_3$, among others. The dielectric layer 34 can be formed by conventional methods, for example, RF-magnetron sputtering, chemical vapor deposition (CVD), or other suitable deposition method. The dielectric layer 34 (e.g., $Ta_2O_5$) formed on the ruthenium electrode 30 is properly crystallized with a textured, hexagonal crystalline structure or phase, or will crystallize upon a moderate (about 400-650° C.) thermal anneal.

The dielectric layer can also be formed from a low k dielectric material, for example, $SiO_2$, $Si_3N_4$, or a composite thereof.

Figure 6:
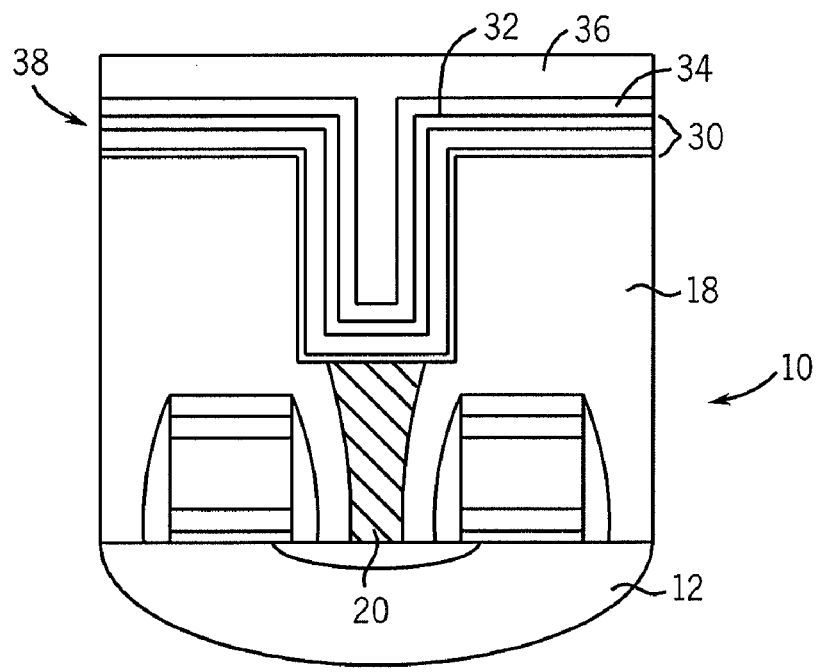

As illustrated in FIG. 6, a conductive material is then deposited to form the upper electrode or plate 36 of the capacitor 38. The top electrode 36 can be formed of any conductive material, for example, a metal (e.g., ruthenium, platinum, rhodium, etc.), a conductive metal oxide (e.g., ruthenium oxide, iridium oxide, etc.), or doped polysilicon. The layers can then be patterned by known techniques as conventional in the art, and the substrate further processed as desired.

Figure 7:
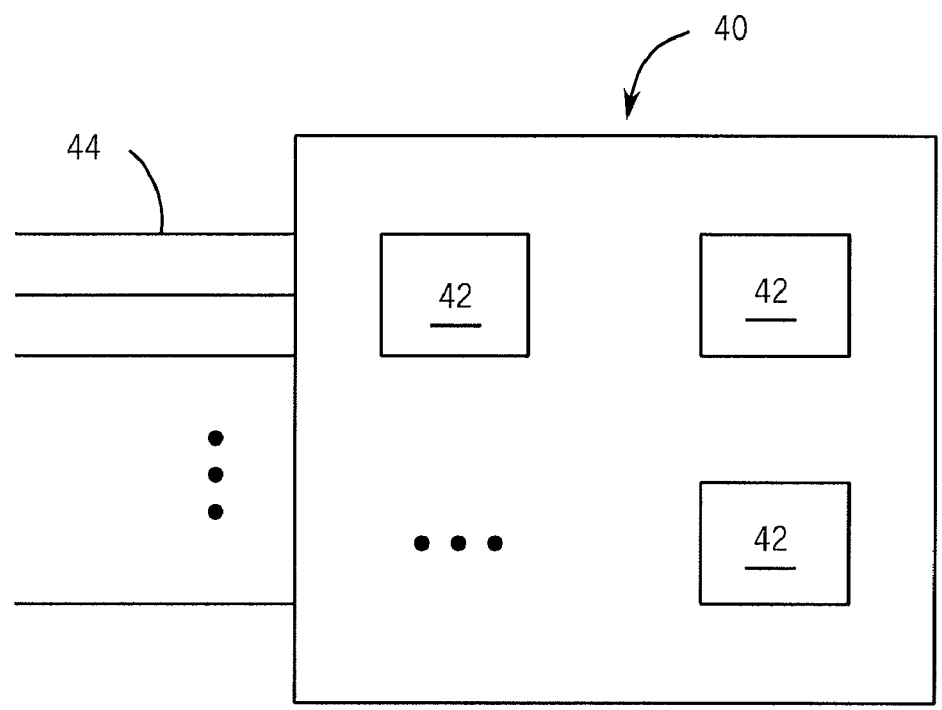
FIG. 7 is a block diagram of a circuit module according to an embodiment of the present invention.

FIG. 7 is a block diagram of an embodiment of a circuit module 40 in which the present invention can be incorporated. Such modules, devices and systems (e.g., processor systems) incorporating the module are described and illustrated in U.S. Pat. No. 6,437,417 (Gilton) and U.S. Pat. No. 6,465,829 (Agarwal), the disclosures of which are incorporated by reference herein. In brief, two or more dies 42 may be combined into a circuit module 40 to enhance or extend the functionality of an individual die 42. Circuit module 40 can be a combination of dies 42 representing a variety of functions, or a combination of dies containing the same functionality. One or more dies 42 of the circuit module can contain circuitry, or integrated circuit devices, that include at least one ruthenium layer 30 or capacitor 30 or other device incorporate the ruthenium layer 30 in accordance with the embodiments of the present invention. The integrated circuit devices can include a memory cell that comprises a ruthenium layer as discussed in the various embodiments in accordance with the invention.

Some examples of a circuit module include memory modules, device drivers, power modules, communication modems, processor modules, and application-specific modules, and may include multilayer, multichip modules. Circuit module 40 can be a subcomponent of a variety of electronic systems, such as a clock, a television, a cell phone, a personal computer, an automobile, an industrial control system, an aircraft, among others. Circuit module 40 will have a variety of leads 44 extending therefrom and coupled to the dies 42 providing unilateral or bilateral communication and control.

The circuit module can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and optionally user interface components, and other associated components such as modems, device driver cards, etc. Examples of memory circuits include but are not limited to DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

Although specific embodiments have been illustrated and described herein, it will be appreciated by those of ordinary skill in the art that any arrangement which is calculated to achieve the same purpose can be substituted for the specific embodiments shown. This application is intended to cover any adaptations or variations that operate according to the principles of this disclosure as described herein. It is therefore intended that such changes and modifications be covered by the appended claims and the equivalents thereof. The disclosures of patents, references and publications cited in the application are incorporated by reference herein.

What is claimed is:

1. A method of forming a ruthenium layer on a substrate, comprising:
   exposing a substrate to a ruthenium precursor and a silicon precursor to form an adhesion layer consisting essentially of ruthenium and silicon; and
   exposing the adhesion layer to a ruthenium precursor and a hydrogen source gas selected from the group consisting of $H_2$ and $NH_3$ without the silicon precursor by chemical vapor deposition to form a hydrogen-treated ruthenium layer on the adhesion layer,
   wherein the hydrogen-treated ruthenium layer is a graded layer having a thickness and a surface and comprises ruthenium and silicon, with an increasing concentration of ruthenium and a decreasing concentration of silicon extending through said thickness from the adhesion layer to the surface, and the surface being substantially free of silicon.

2. The method of claim 1, further comprising, prior to exposing the substrate to the ruthenium and silicon precursors, exposing the substrate to the silicon precursor alone.

3. The method of Claim 1, wherein the silicon concentration of the adhesion layer is about 10-90 at.-% and the silicon concentration of the hydrogen-treated ruthenium layer decreases through said thickness such that the silicon concentration at the surface of the hydrogen-treated ruthenium layer is about 0-0.01 at.-%.

4. The method of claim 1, wherein the hydrogen-treated ruthenium layer is about 50-300 angstroms thick and substantially free of silicon from said surface to a depth of about 10-30 angstroms.

5. The method of claim 1, wherein the hydrogen-treated ruthenium layer forms an effective silicon diffusion barrier.

6. The method of claim 1, wherein the adhesion layer consists essentially of ruthenium silicide.

7. The method of claim 1, wherein the adhesion layer is about 2-50 angstroms thick, and the hydrogen-treated ruthenium layer is about 50-300 angstroms thick.

8. The method of claim 1, wherein the adhesion layer is about a monolayer thick.

9. The method of claim 1, further comprising, exposing the substrate to a ruthenium precursor without the hydrogen source gas, to form a ruthenium layer on said hydrogen-treated ruthenium layer.

10. The method of claim 9, wherein said ruthenium layer is about 0-300 angstroms thick.

11. The method of claim 9, wherein said ruthenium layer is substantially free of silicon.

12. A method of forming a ruthenium layer on a substrate, comprising:
    forming a nucleation layer consisting essentially of ruthenium silicide on the substrate; and
    forming a layer of ruthenium on the nucleation layer from a ruthenium precursor and a hydrogen source gas selected from the group consisting of $H_2$ and $NH_3$ without a silicon source, the ruthenium layer having a surface and a thickness;
    wherein the ruthenium layer comprises ruthenium and silicon, with an increasing concentration of ruthenium and a decreasing concentration of silicon extending through said thickness from the nucleation layer to said surface, and the surface being substantially free of silicon.

13. The method of claim 12, further comprising forming a second layer of ruthenium on said ruthenium layer from a ruthenium precursor without the hydrogen source gas.

14. The method of claim 12, wherein forming the nucleation layer comprises chemical vapor depositing ruthenium and silicon on the substrate from a ruthenium precursor gas and a silicon precursor gas.

15. The method of claim 12, wherein forming the nucleation layer comprises a physical vapor deposition of a ruthenium precursor and a silicon precursor.

16. The method of claim 12, wherein forming the ruthenium layers comprises a chemical vapor deposition.

17. The method of claim 12, wherein the substrate comprises borophosphosilicate glass, phosphosilicate glass, or silicon nitride.

18. A method of forming a ruthenium layer on a substrate, comprising:
    forming a silicon layer on the substrate;
    forming a nucleation layer consisting essentially of ruthenium silicide on said silicon layer; and
    forming a layer of ruthenium on the nucleation layer from a ruthenium precursor gas and a hydrogen source gas selected from the group consisting of $H_2$ and $NH_3$ without a silicon source gas by chemical vapor deposition, the ruthenium layer having a surface and a thickness;
    wherein the ruthenium layer comprises ruthenium and silicon, with an increasing concentration of ruthenium and a decreasing concentration of silicon extending through said thickness from the nucleation layer to said surface, and the surface being substantially free of silicon.

19. The method of claim 18, further comprising forming a second layer of ruthenium on said ruthenium layer from a ruthenium precursor gas without the hydrogen source gas.

20. A method of forming a ruthenium layer on a substrate, comprising:
    depositing a ruthenium and silicon material on said substrate to form a nucleation layer consisting essentially of ruthenium and silicon; and
    depositing a layer of ruthenium on the nucleation layer from a ruthenium precursor gas and a hydrogen source gas selected from the group consisting of $H_2$ and $NH_3$ without a silicon source gas by chemical vapor deposition, the ruthenium layer having a surface and a thickness;
    wherein the ruthenium layer comprises ruthenium and silicon, with an increasing concentration of ruthenium and a decreasing concentration of silicon extending through said thickness from the nucleation layer to said surface, and the surface being substantially free of silicon.

21. The method of claim 20, further comprising depositing a second layer of ruthenium on said ruthenium layer from a ruthenium precursor gas without the hydrogen source gas.

22. A method of forming a ruthenium layer on a substrate, comprising:
    forming a nucleation layer comprising ruthenium with no oxygen on the substrate;
    forming a layer of ruthenium on the nucleation layer from a ruthenium precursor and a hydrogen source gas selected from the group consisting of $H_2$ and $NH_3$ without a silicon source by chemical vapor deposition,
    wherein the ruthenium layer comprises ruthenium and silicon, with an increasing concentration of ruthenium and a decreasing concentration of silicon extending through said thickness from the nucleation layer to said surface, and the surface being substantially free of silicon; and
    forming a dielectric material on the ruthenium layer.

23. The method of claim 22, wherein the dielectric material is a high K dielectric material.

24. The method of claim 23, wherein the high K dielectric material comprises tantalum oxide having a hexagonal crystalline structure throughout.

25. The method of claim 22, further comprising forming a second layer of ruthenium on said ruthenium layer from a ruthenium precursor without the hydrogen source gas.

26. A method of fabricating a capacitor, comprising:
    forming a first electrode on a substrate by:
        forming a nucleation layer comprising ruthenium with no oxygen on the substrate; and
        forming a layer of ruthenium on the nucleation layer from a ruthenium precursor and a hydrogen source gas selected from the group consisting of $H_2$ and $NH_3$ without a silicon source by chemical vapor deposition, wherein the ruthenium layer comprises ruthenium and silicon, with an increasing concentration of ruthenium and a decreasing concentration of silicon extending through said thickness from the nucleation layer to said surface, and the surface being substantially free of silicon;
    forming a dielectric material over the ruthenium layer; and
    forming a second electrode on the dielectric material.

27. The method of claim 26, wherein the capacitor is formed within an opening in the substrate.

28. The method of claim 26, wherein the nucleation layer is formed by CVD processing of a ruthenium precursor gas and a silicon precursor gas to form an about 2-50 angstrom thick layer of ruthenium silicide on the substrate.

29. The method of claim 26, wherein the ruthenium layer is formed by CVD processing of a ruthenium precursor gas.

30. The method of claim 26, wherein the ruthenium layer is about 50-300 angstroms thick.

31. The method of claim 26, further comprising forming a second layer of ruthenium on said ruthenium layer from a ruthenium precursor without the hydrogen source gas to a thickness of about 0-300 angstroms.

32. A method of fabricating a capacitor, comprising:
  forming a first electrode on a substrate by:
    forming a nucleation layer comprising silicon and ruthenium and no oxygen on the substrate;
    forming a layer of ruthenium on the nucleation layer from a ruthenium precursor and a hydrogen source gas selected from the group consisting of $H_2$ and $NH_3$ without a silicon source by chemical vapor deposition, wherein the ruthenium layer comprises ruthenium and silicon, with an increasing concentration of ruthenium and a decreasing concentration of silicon extending through said thickness from the nucleation layer to said surface, and the surface being substantially free of silicon; and
  forming a dielectric material over the ruthenium layer; and
  forming a second electrode on the dielectric material.

33. A method of forming a ruthenium layer on a substrate, comprising:
  exposing a substrate to a ruthenium precursor, a silicon precursor and an oxidizing gas to form an adhesion layer comprising $RuSi_xO_y$; and
  exposing the adhesion layer to a ruthenium precursor gas and a hydrogen source gas selected from the group consisting of $H_2$ and $NH_3$ without the silicon precursor gas or the oxidizing gas by chemical vapor deposition to form a hydrogen-treated ruthenium layer on the adhesion layer,
  wherein the hydrogen-treated ruthenium layer comprises ruthenium and silicon, with an increasing concentration of ruthenium and a decreasing concentration of silicon extending through said thickness from the adhesion layer to said surface, and the surface being substantially free of silicon.

34. A method of forming a ruthenium layer on a substrate, comprising:
  exposing a substrate to a silicon precursor to form a silicon layer about 2-5 angstroms thick;
  exposing said silicon layer to a ruthenium precursor, a silicon precursor and optionally an oxidizing gas, to form an adhesion layer thereon comprising ruthenium and silicon, and optionally oxygen; and
  exposing the adhesion layer to a ruthenium precursor and a hydrogen source gas selected from the group consisting of $H_2$ and $NH_3$ without the silicon precursor or the oxidizing gas by chemical vapor deposition to form a hydrogen-treated ruthenium layer thereon,
  wherein the hydrogen-treated ruthenium layer comprises ruthenium and silicon, with an increasing concentration of ruthenium and a decreasing concentration of silicon extending through said thickness from the adhesion layer to said surface, and the surface being substantially free of silicon.

35. The method of claim 34, wherein the silicon layer is exposed to ruthenium and silicon precursors and an oxidizing gas, and the adhesion layer comprises $RuSi_xO_y$.

36. The method of claim 34, wherein the silicon layer is exposed to ruthenium and silicon precursors and no oxidizing gas, and the adhesion layer consists essentially of $RuSi_x$.

37. The method of claim 34, further comprising, exposing the hydrogen-treated ruthenium layer to a ruthenium precursor without the hydrogen source gas to form a layer of ruthenium thereon.

* * * * *